(12) United States Patent
Chen et al.

(10) Patent No.: US 11,756,888 B2
(45) Date of Patent: *Sep. 12, 2023

(54) SEMICONDUCTOR DEVICE HAVING CONTACT PLUG CONNECTED TO GATE STRUCTURE ON PMOS REGION

(71) Applicant: UNITED MICROELECTRONICS CORP., Hsin-Chu (TW)

(72) Inventors: Shih-Cheng Chen, Tainan (TW); Li-Hsuan Ho, Kaohsiung (TW); Tsuo-Wen Lu, Kaohsiung (TW); Shih-Hao Liang, Tainan (TW); Tsung-Hsun Wu, Kaohsiung (TW); Po-Jen Chuang, Kaohsiung (TW); Chi-Mao Hsu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 46 days.

This patent is subject to a terminal disclaimer.

(21) Appl. No.: 17/493,852

(22) Filed: Oct. 5, 2021

(65) Prior Publication Data

US 2022/0028787 A1 Jan. 27, 2022

Related U.S. Application Data

(63) Continuation of application No. 16/695,028, filed on Nov. 25, 2019, now Pat. No. 11,171,091.

(30) Foreign Application Priority Data

Oct. 28, 2019 (CN) .......................... 201911033932.5

(51) Int. Cl.
*H01L 23/535* (2006.01)
*H01L 21/28* (2006.01)
(Continued)

(52) U.S. Cl.
CPC ...... *H01L 23/535* (2013.01); *H01L 21/28088* (2013.01); *H01L 21/82385* (2013.01);
(Continued)

(58) Field of Classification Search
CPC ............. H01L 23/535; H01L 21/28088; H01L 21/82385; H01L 21/823871; H01L 23/528;
(Continued)

(56) References Cited

U.S. PATENT DOCUMENTS 6,383,904 B1 5/2002 Yu
11,171,091 B2 * 11/2021 Chen .................... H01L 23/535
(Continued)

*Primary Examiner* — Herve-Louis Y Assouman
(74) *Attorney, Agent, or Firm* — Winston Hsu

(57) ABSTRACT

A semiconductor device including a substrate having a NMOS region and a PMOS region; a metal gate extending continuously along a first direction from the NMOS region to the PMOS region on the substrate; a first source/drain region extending along a second direction adjacent to two sides of the metal gate on the NMOS region; a second source/drain region extending along the second direction adjacent to two sides of the metal gate on the PMOS region; a first contact plug landing on the second source/drain region adjacent to one side of the metal gate; a second contact plug landing on the second source/drain region adjacent to another side of the metal gate; and a third contact plug landing directly on a portion of the metal gate on the PMOS region and between the first contact plug and the second contact plug.

5 Claims, 4 Drawing Sheets

(51) Int. Cl.
   *H01L 21/8238* (2006.01)
   *H01L 23/528* (2006.01)
   *H01L 27/092* (2006.01)
   *H01L 29/49* (2006.01)
   *H01L 29/66* (2006.01)
   *H01L 27/02* (2006.01)

(52) U.S. Cl.
   CPC .... *H01L 21/823871* (2013.01); *H01L 23/528* (2013.01); *H01L 27/092* (2013.01); *H01L 29/4966* (2013.01); *H01L 29/66545* (2013.01)

(58) Field of Classification Search
   CPC ............... H01L 27/092; H01L 29/4966; H01L 29/66545; H01L 27/0207; H01L 21/823842; H01L 29/513; H01L 29/517; H01L 27/0924
   See application file for complete search history.

(56) References Cited

U.S. PATENT DOCUMENTS

| | | |
|---|---|---|
| 2007/0284671 A1 | 12/2007 | Tsutsumi |
| 2009/0152734 A1 | 6/2009 | Smayling |
| 2012/0001271 A1 | 1/2012 | Chae |
| 2017/0330952 A1 | 11/2017 | Su |

\* cited by examiner

SEMICONDUCTOR DEVICE HAVING CONTACT PLUG CONNECTED TO GATE STRUCTURE ON PMOS REGION

CROSS REFERENCE TO RELATED APPLICATIONS

This is a continuation application of U.S. patent application Ser. No. 16/695,028, filed on Nov. 25, 2019, and all benefits of such earlier application are hereby claimed for this new continuation application.

BACKGROUND OF THE INVENTION

1. Field of the Invention

The invention relates to a semiconductor device, and more particularly to a semiconductor device having contact plug connecting gate structure on PMOS region.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the fabrication of CMOS devices, metal boundary effect caused by overlapping of work function metal layers from NMOS region and PMOS region is often observed. Hence how to resolve this issue has become an important task in this field.

SUMMARY OF THE INVENTION

According to an embodiment of the present invention, a semiconductor device including a substrate having a NMOS region and a PMOS region; a metal gate extending continuously along a first direction from the NMOS region to the PMOS region on the substrate; a first source/drain region extending along a second direction adjacent to two sides of the metal gate on the NMOS region; a second source/drain region extending along the second direction adjacent to two sides of the metal gate on the PMOS region; a first contact plug landing on the second source/drain region adjacent to one side of the metal gate; a second contact plug landing on the second source/drain region adjacent to another side of the metal gate; and a third contact plug landing directly on a portion of the metal gate on the PMOS region and between the first contact plug and the second contact plug. Preferably, the first contact plug, the second contact plug, and the third contact plug form a straight line extending along the second direction.

According to another aspect of the present invention, a semiconductor device includes a substrate having a NMOS region and a PMOS region; a metal gate extending continuously along a first direction from the NMOS region to the PMOS region on the substrate; a first source/drain region extending along a second direction adjacent to two sides of the metal gate on the NMOS region; a second source/drain region extending along the second direction adjacent to two sides of the metal gate on the PMOS region; a first contact plug landing on the second source/drain region adjacent to one side of the metal gate; a second contact plug landing on the second source/drain region adjacent to another side of the metal gate; and a third contact plug landing directly on a portion of the metal gate on the PMOS region and between the second source/drain region and a boundary separating the NMOS region and the PMOS region.

According to yet another aspect of the present invention, a semiconductor device includes a substrate having a NMOS region and a PMOS region; a metal gate extending continuously along a first direction from the NMOS region to the PMOS region on the substrate; a first source/drain region extending along a second direction adjacent to two sides of the metal gate on the NMOS region; a second source/drain region extending along the second direction adjacent to two sides of the metal gate on the PMOS region; a first contact plug landing on the second source/drain region adjacent to one side of the metal gate; a second contact plug landing on the second source/drain region adjacent to another side of the metal gate; and a third contact plug landing directly on a portion of the metal gate on the PMOS region and not between the first source/drain region and the second source/drain region and away from a boundary separating the NMOS region and the PMOS region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
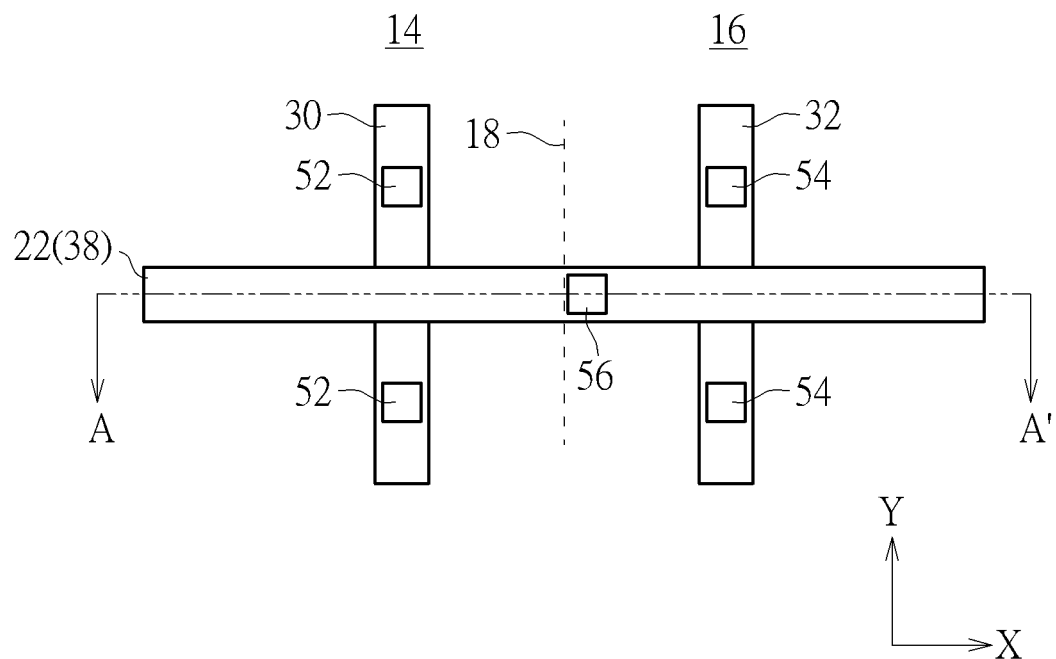
FIG. 1 illustrates a top view of a semiconductor device according to an embodiment of the present invention.
Figure 2:
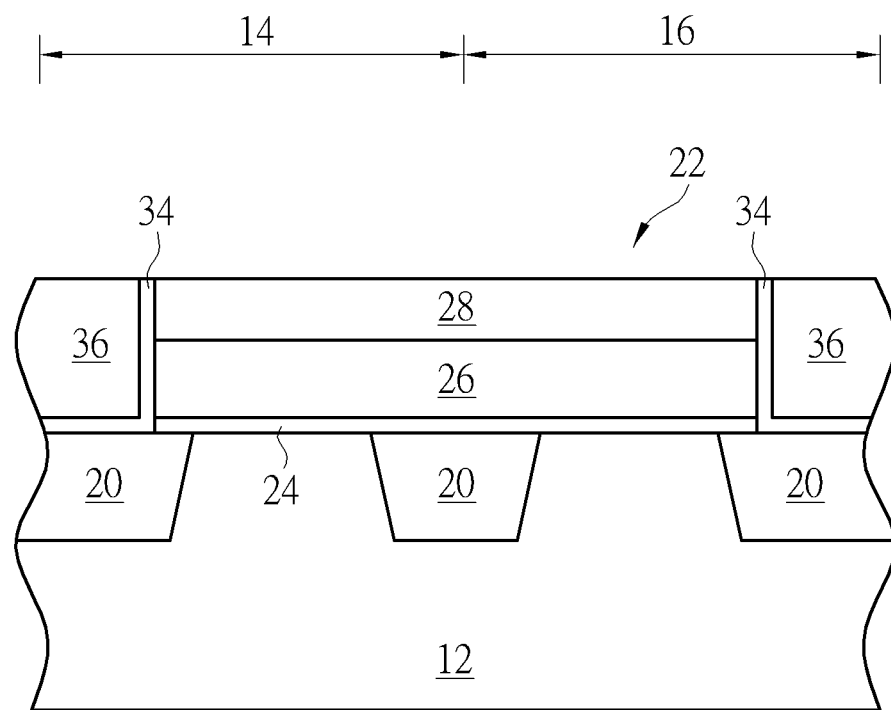
FIGS. 2-3 are cross-sectional views illustrating a method for fabricating the semiconductor device along the sectional line AA' of FIG. 1.
Figure 3:
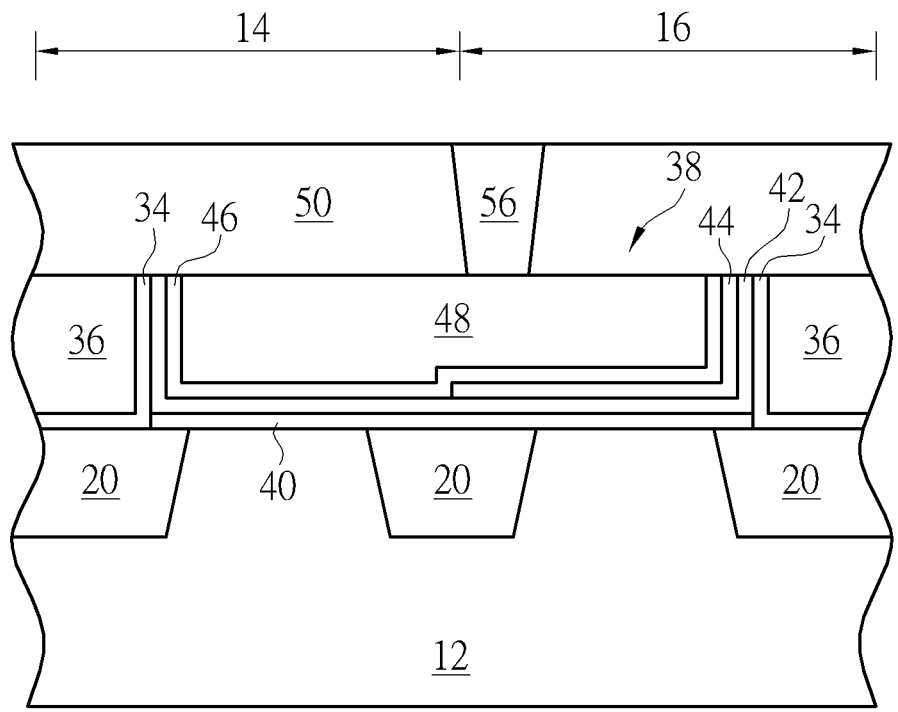

Referring to FIGS. 1-3, FIGS. 1-3 illustrate a method for fabricating semiconductor device according to an embodiment of the present invention, in which FIG. 1 illustrates a top view of a semiconductor device according to an embodiment of the present invention and FIGS. 2-3 are cross-sectional views illustrating a method for fabricating the semiconductor device along the sectional line AA'. As shown in FIG. 1, a substrate 12 is first provided and at least a transistor region such as a first region and a second region are defined on the substrate. In this embodiment, the first region is preferably a NMOS region 14 while the second region is a PMOS region 16, a boundary 18 is defined between and separate the NMOS region 14 and the PMOS region 16, and a shallow trench isolation (STI) 20 made of silicon oxide is formed in the substrate 12 to separate the NMOS region 14 and PMOS region 16. It should be noted that even though this embodiment pertains to the fabrication of a planar FET device, it would also be desirable to apply the following processes to a non-planar FET device such as FinFET device, which is also within the scope of the present invention.

Next, at least a gate structure 22 or dummy gate is formed on the substrate 12. In this embodiment, the formation of the gate structure 22 could be accomplished by a gate first process, a high-k first approach from gate last process, or a high-k last approach from gate last process. Since this embodiment pertains to a high-k last approach, a gate dielectric layer 24 or interfacial layer, a gate material layer 26 made of polysilicon, and a selective hard mask 28 could be formed sequentially on the substrate 12, and a pattern transfer process is then conducted by using a patterned resist (not shown) as mask to remove part of the hard mask 28, part of the gate material layer 26, and part of the gate dielectric layer 24 through single or multiple etching processes. After stripping the patterned resist, a gate structure 22 made of a patterned gate dielectric layer 24, a patterned gate material layer 26, and a patterned hard mask 28 is formed on the substrate 12. As shown in FIG. 1, the gate structures 22 is preferably extending along a first direction (such as X-direction) on both the NMOS region 14 and PMOS region 16 on the substrate 12.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 24 could include $SiO_2$, SiN, or high-k dielectric material, the gate material layer 26 could include metal, polysilicon, or silicide, and the material of the hard mask 28 could be selected from the group consisting of $SiO_2$, SiN, SiC, and SiON.

Next, at least a spacer (not shown) is formed on sidewalls of the gate structure 22, source/drain regions 30, 32 and/or epitaxial layer are formed in the substrate 12 adjacent to two sides of the spacer on the NMOS region 14 and PMOS region 16, selective silicide layers (not shown) could be formed on the surface of the source/drain regions 30, 32, and a contact etch stop layer (CESL) 34 is formed on the surface of the substrate 12 and the gate structure 22. As shown in FIG. 1, the source/drain regions 30, 32 are extended along a second direction (such as Y-direction) orthogonal to the first direction in the substrate 12 adjacent to two sides of the gate structure 22 on the NMOS region 14 and PMOS region 16 respectively.

In this embodiment, the spacer could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The source/drain regions 30, 32 could include n-type dopants or p-type dopants depending on the type of device being fabricated. The CESL 34 is preferably made of SiN or SiCN, but not limited thereto.

Next, an inter-layer dielectric (ILD) layer 36 is disposed on the CESL 34, and a planarizing process such as chemical mechanical polishing (CMP) process is conducted to remove part of the ILD layer 36 and part of the CESL 34 to expose the hard mask 28 so that the top surfaces of the hard mask 28 and the ILD layer 36 are coplanar.

Next, a replacement metal gate (RMG) process is conducted to transform the gate structure 22 on the NMOS region 14 and PMOS region 16 into metal gate 38. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard mask 28, gate material layer 26 and even gate dielectric layer 24 for forming a recess (not shown) in the ILD layer 36 extending from the NMOS region 14 to PMOS region 16. Next, a selective interfacial layer or gate dielectric layer 40, a high-k dielectric layer 42, a selective barrier layer (not shown), and a work function metal layer 44 are formed in the recess extending from NMOS region 14 to PMOS region 16, another patterned mask (not shown) such as patterned resist is formed to cover the NMOS region 14, an etching process is conducted to remove the work function metal layer 44 on the NMOS region 14, the patterned mask is stripped from the NMOS region 14, and another work function metal layer 46 is formed on both NMOS region 14 and PMOS region 16. Next, a selective barrier layer (not shown) such as a top barrier metal (TBM) and a low resistance metal layer 48 are formed in the recess, and a planarizing process such as CMP is conducted to form metal gate 38 extending from the NMOS region 14 to PMOS region 16.

In this embodiment, the high-k dielectric layer 42 is preferably selected from dielectric materials having dielectric constant (k value) larger than 4. For instance, the high-k dielectric layer 72 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 46 is preferably a n-type work function metal layer having a work function ranging between 3.9 eV and 4.3 eV, which may include titanium aluminide (TiAl), zirconium aluminide (ZrAl), tungsten aluminide (WAl), tantalum aluminide (TaAl), hafnium aluminide (HfAl), or titanium aluminum carbide (TiAlC), or any combination thereof. The work function metal layer 44 on the other hand is a p-type work function metal layer having a work function ranging between 4.8 eV and 5.2 eV, which may include titanium nitride (TiN), tantalum nitride (TaN), tantalum carbide (TaC), or any combination thereof. The material of the low-resistance metal layer 48 may include copper (Cu), aluminum (Al), titanium aluminum (TiAl), cobalt tungsten phosphide (CoWP) or any combination thereof.

Next, another ILD layer 50 or inter-metal dielectric (IMD) layer could be formed on the metal gate 38 and one or more photo-etching process is conducted by using a patterned mask (not shown) as mask to remove part of the ILD layers 36, 50 and CESL 34 for forming contact holes (not shown) exposing the metal gate 38 and the source/drain regions 30, 32 adjacent to two sides of the metal gate 38. Next, conductive materials including a barrier layer selected from the group consisting of Ti, TiN, Ta, and TaN and a low resistance metal layer selected from the group consisting of W, Cu, Al, TiAl, and CoWP are deposited into the contact holes, and a planarizing process such as CMP is conducted to remove part of aforementioned barrier layer and low resistance metal layer for forming contact plugs electrically connecting the source/drain region 30, 32 and the metal gate 38. As shown in FIGS. 1 and 3, the contact plugs fabricated in this embodiment preferably includes contact plugs 52 electrically or directly connecting the source/drain region 30 on NMOS region 14, contact plugs 54 electrically or directly connecting the source/drain region 32 on PMOS region 16, and a contact plug (or also referred to as gate contact plug 56) electrically or directly connecting the gate structure 22 or metal gate 38 extending from the NMOS region 14 to PMOS region 16. This completes the fabrication of a semiconductor device according to a preferred embodiment of the present invention.

Referring again to FIG. 1, which illustrates a top view of a semiconductor device fabricated through the process shown in FIGS. 2-3 according to an embodiment of the present invention. As shown in FIG. 1, in contrast to the contact plug connecting to the gate structure is typically disposed directly on the boundary 18 between NMOS region 14 and PMOS region 16 in convention art, the present invention preferably adjusts the position of the gate contact plug 56 so that the gate contact plug 56 is disposed closer to the PMOS region 16 or even landed anywhere on the gate structure 22 within the PMOS region 16.

For instance, as shown in FIG. 1, the gate contact plug 56 if viewed from a top view perspective could be disposed slightly toward the PMOS region 16 and landed directly on or directly contacting the gate structure 22 on the PMOS region, in which the gate contact plug 56 under a top view perspective is substantially rectangular and an edge of the gate contact plug 56 could be overlapping the boundary 18 between NMOS region 14 and PMOS region 18 or not overlapping the boundary 18 as shown in FIG. 1. In other words, the edge of the rectangular gate contact plug 56 could be overlapping the boundary 18 or immediately adjacent to but not overlapping the boundary 18 as shown in FIG. 1.

Figure 4:
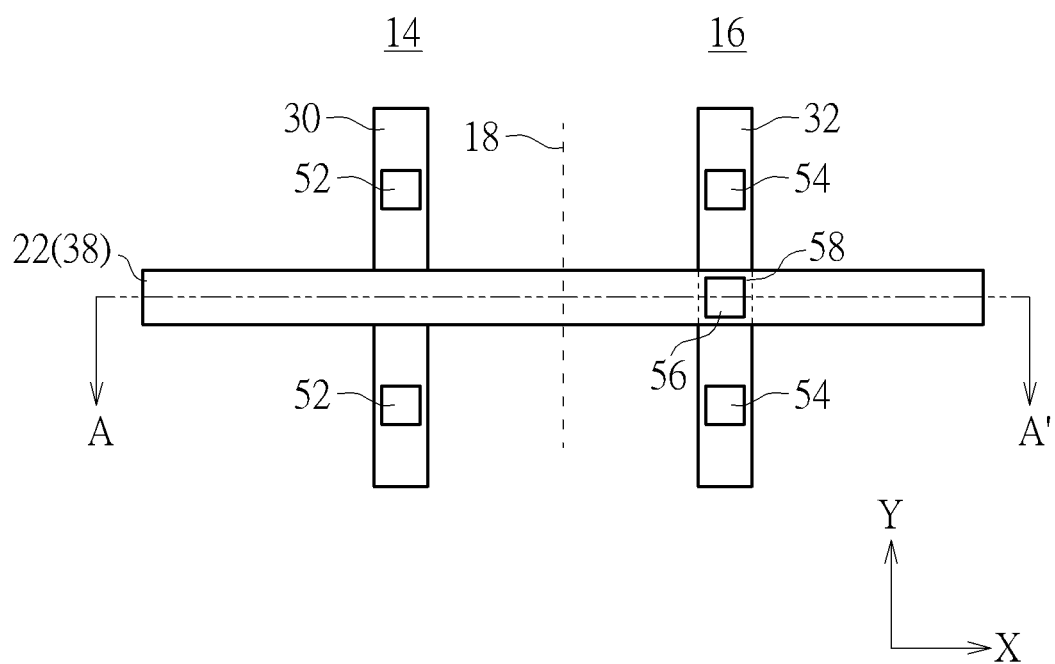
FIG. 4 illustrates a top view of a semiconductor device according to an embodiment of the present invention.

Referring to FIG. 4, FIG. 4 illustrates a top view of a semiconductor device fabricated through the process shown in FIGS. 2-3 according to an embodiment of the present invention. As shown in FIG. 4, in contrast to landing the gate contact plug 56 within the PMOS region 16 and immediately adjacent to the boundary 18 between NMOS region 14 and PMOS region 16 as disclosed in the aforementioned embodiment, it would also be desirable to move the gate contact plug 56 farther away from the boundary 18 and land the gate contact plug 56 on the gate structure 22 and directly on top of a channel region 58 in the PMOS region 16. In other words, the gate contact plug 56 could be positioned on the gate structure 22 directly on top of a channel region 58 between the source/drain regions 32. According to an embodiment of the present invention, the position of the gate contact plug 56 could be adjusted by moving the gate contact plug 56 from the overlapped region of the gate structure 22 and channel region 58 toward the NMOS region 14 or away from the NMOS region 14 at an increment of 0 to 5 times the critical dimension or more specifically the width of the gate structure 22, in which 0 times the width of gate structure 22 refers to the state when the gate contact plug 56 completely overlaps or landed directly on the channel region 58 as disclosed in this embodiment. In other words, the gate contact plug 56 landing on the overlapped region of the gate structure 22 and channel region 58 is equivalent to 0 times the distance of the critical dimension of gate structure 22.

Figure 5:
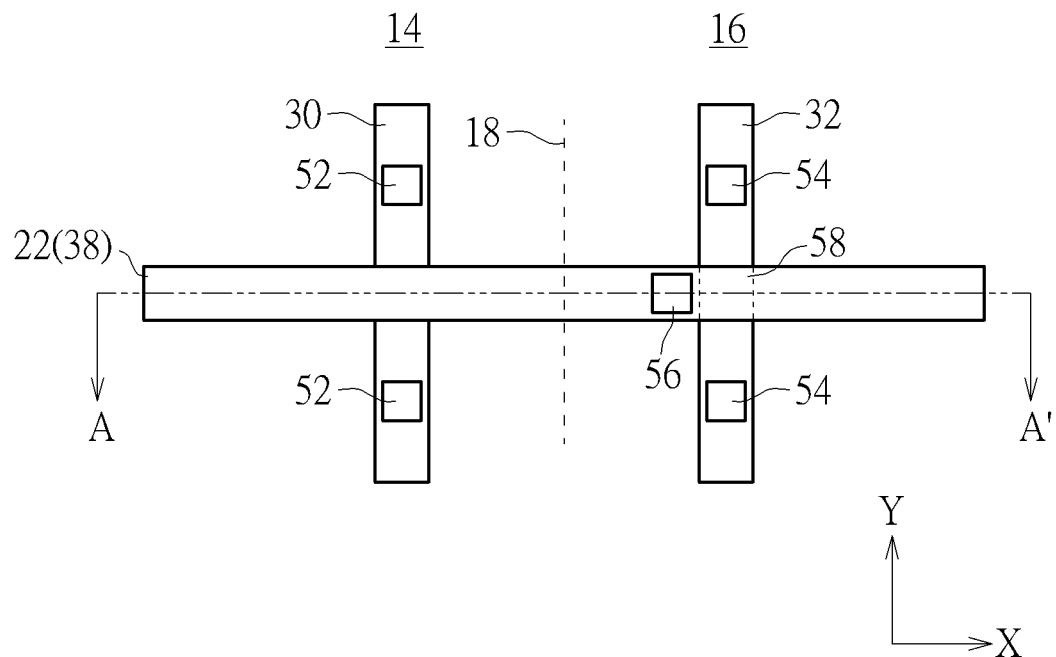
FIG. 5 illustrates a top view of a semiconductor device according to an embodiment of the present invention.

Referring to FIG. 5, FIG. 5 illustrates a top view of a semiconductor device fabricated through the process shown in FIGS. 2-3 according to an embodiment of the present invention. As shown in FIG. 5, in contrast to the gate contact plug 56 is landed at 0 times the critical dimension of gate structure 22 on the intersecting region of the gate structure 22 and channel region 58 in previous embodiment, it would also be desirable to move the gate contact plug 56 from the position shown in FIG. 4 at one width of the gate structure 22 increment toward the NMOS region 14 so that the gate contact plug 56 is disposed directly on the gate structure 22 on one side of the source/drain region 32 and closer to the boundary 18.

Figure 6:
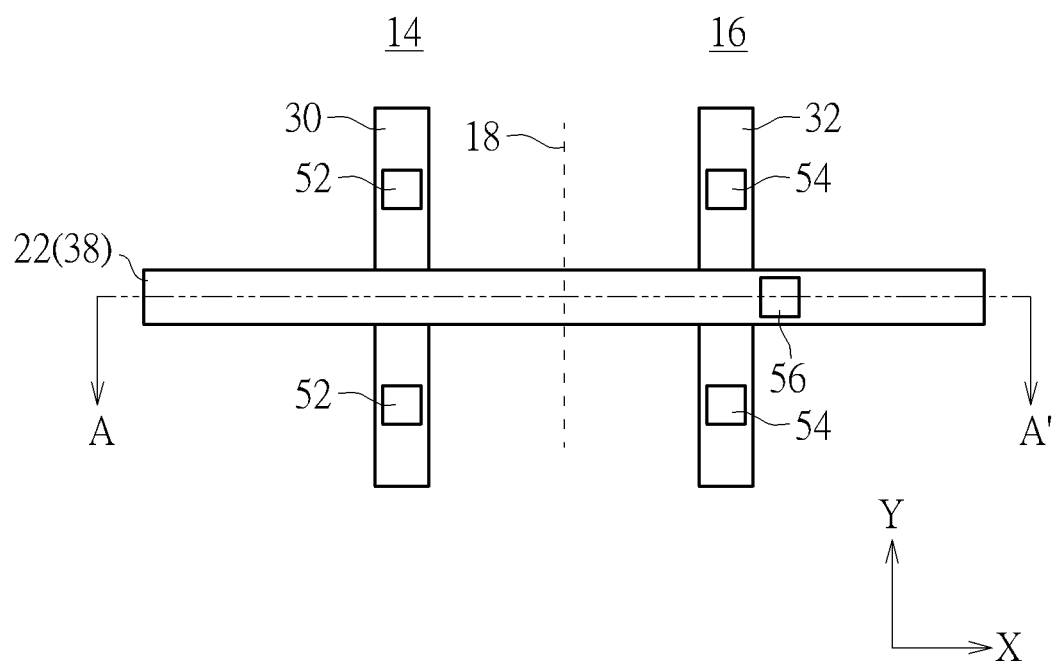
FIG. 6 illustrates a top view of a semiconductor device according to an embodiment of the present invention.

Referring to FIG. 6, FIG. 6 illustrates a top view of a semiconductor device fabricated through the process shown in FIGS. 2-3 according to an embodiment of the present invention. As shown in FIG. 6, in contrast to the gate contact plug 56 is landed from the position in FIG. 4 at one width of the gate structure 22 toward the NMOS region 14 in previous embodiment, the present embodiment preferably moves the gate contact plug 56 from the position shown in FIG. 4 at one width of gate structure 22 away from the NMOS region 14 so that the gate contact plug 56 is disposed directly on the gate structure 22 on one side of the source/drain region 32 and away from the boundary 18.

Figure 7:
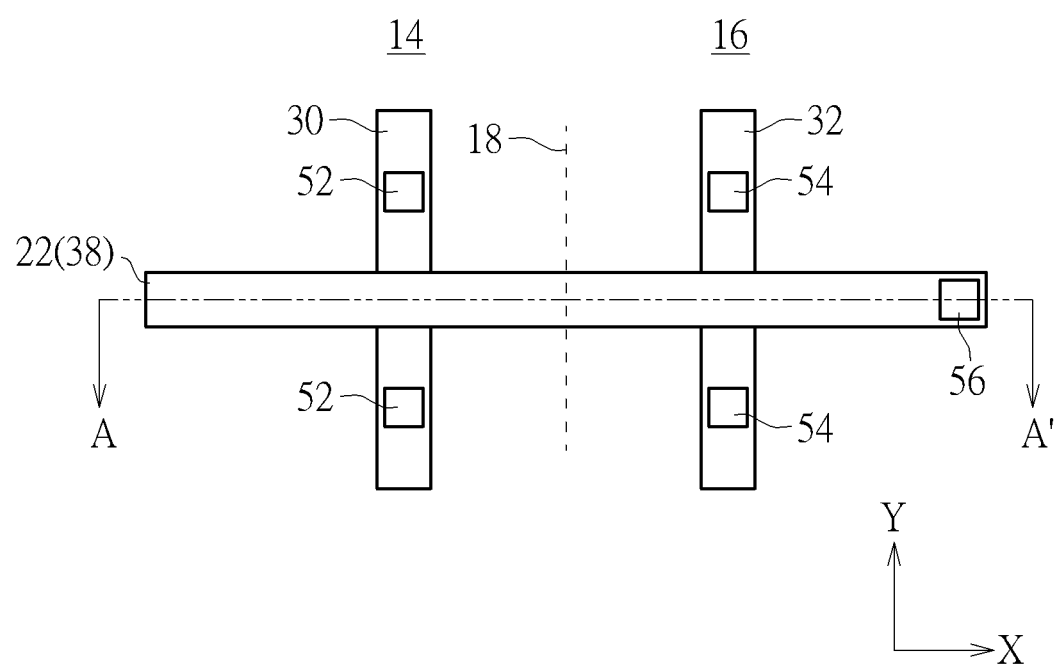
FIG. 7 illustrates a top view of a semiconductor device according to an embodiment of the present invention.

Referring to FIG. 7, FIG. 7 illustrates a top view of a semiconductor device fabricated through the process shown in FIGS. 2-3 according to an embodiment of the present invention. As shown in FIG. 7, in contrast to the gate contact plug 56 is landed from the position in FIG. 4 at one width of the gate structure 22 away from the NMOS region 14 in previous embodiment, the gate contact plug 56 in this embodiment is preferably moved from the position shown in FIG. 4 at 5 times the widths of the gate structures 22 away from the NMOS region 14, which is also within the scope of the present invention.

Overall, the present invention preferably adjusts the position of the gate contact plug (specifically refers to the contact plug directly contacting the gate line or gate structure extending from NMOS region to PMOS region) during the fabrication of CMOS transistor device so that the gate contact plug is landed directly on the gate structure closer to the PMOS region from a boundary separating the NMOS region and PMOS region. By following this approach, it would be desirable to improve the metal boundary effect resulted from overlapping of work function metal layers formed during fabrication of CMOS device. According to the aforementioned embodiments, the CMOS transistor device of the present invention preferably includes only one single gate contact plug or more specifically only one single gate contact plug is directly connecting the gate structure extending from NMOS region to PMOS region, in which the gate contact plug is most preferably landed on the gate structure within the PMOS region and further away from the NMOS region, such as the position of the gate contact plug 56 shown in FIG. 6 or FIG. 7.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate having a NMOS region and a PMOS region;
   a metal gate extending continuously along a first direction from the NMOS region to the PMOS region on the substrate;
   a first source/drain region extending along a second direction adjacent to two sides of the metal gate on the NMOS region;
   a second source/drain region extending along the second direction adjacent to two sides of the metal gate on the PMOS region;

a first contact plug landing on the second source/drain region adjacent to one side of the metal gate;

a second contact plug landing on the second source/drain region adjacent to another side of the metal gate; and a third contact plug landing directly on a portion of the metal gate on the PMOS region and between the first contact plug and the second contact plug, wherein the first contact plug, the second contact plug, and the third contact plug form a straight line extending along the second direction.

2. The semiconductor device of claim 1, wherein the third contact plug is disposed on the metal gate directly on top of a channel region between the second source/drain region.

3. A semiconductor device, comprising:

a substrate having a NMOS region and a PMOS region;

a metal gate extending continuously along a first direction from the NMOS region to the PMOS region on the substrate;

a first source/drain region extending along a second direction adjacent to two sides of the metal gate on the NMOS region;

a second source/drain region extending along the second direction adjacent to two sides of the metal gate on the PMOS region;

a first contact plug landing on the second source/drain region adjacent to one side of the metal gate;

a second contact plug landing on the second source/drain region adjacent to another side of the metal gate; and a third contact plug landing directly on a portion of the metal gate on the PMOS region and between the second source/drain region and a boundary separating the NMOS region and the PMOS region.

4. A semiconductor device, comprising:

a substrate having a NMOS region and a PMOS region;

a metal gate extending continuously along a first direction from the NMOS region to the PMOS region on the substrate;

a first source/drain region extending along a second direction adjacent to two sides of the metal gate on the NMOS region;

a second source/drain region extending along the second direction adjacent to two sides of the metal gate on the PMOS region;

a first contact plug landing on the second source/drain region adjacent to one side of the metal gate;

a second contact plug landing on the second source/drain region adjacent to another side of the metal gate; and a third contact plug landing directly on a portion of the metal gate on the PMOS region and not between the first source/drain region and the second source/drain region and away from a boundary separating the NMOS region and the PMOS region.

5. The semiconductor device of claim 4, wherein the third contact plug is landing near an end of the metal gate on the PMOS region.

* * * * *